(12) United States Patent
Komoda

(10) Patent No.: US 7,479,825 B2
(45) Date of Patent: Jan. 20, 2009

(54) CLOCK FORMING METHOD FOR SEMICONDUCTOR INTEGRATED CIRCUIT AND PROGRAM PRODUCT FOR THE METHOD

(75) Inventor: Michio Komoda, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 110 days.

(21) Appl. No.: 11/584,492

(22) Filed: Oct. 23, 2006

(65) Prior Publication Data

US 2007/0094627 A1  Apr. 26, 2007

(30) Foreign Application Priority Data

Oct. 25, 2005  (JP) .............................. 2005-309861

(51) Int. Cl.
*H01L 25/00* (2006.01)
(52) U.S. Cl. ........................ 327/565; 327/415; 327/295
(58) Field of Classification Search ................. 327/293, 327/295, 415, 416, 564, 565, 566
See application file for complete search history.

(56) References Cited

U.S. PATENT DOCUMENTS

| | | | | |
|---|---|---|---|---|
| 6,433,606 B1* | 8/2002 | Arai | ........................... | 327/291 |
| 6,559,701 B1* | 5/2003 | Dillon | ........................ | 327/293 |
| 6,906,572 B2* | 6/2005 | Mizuno | ....................... | 327/295 |
| 7,005,907 B2* | 2/2006 | Ibuka | .......................... | 327/295 |
| 7,245,173 B2* | 7/2007 | Krasnansky | ................ | 327/379 |

FOREIGN PATENT DOCUMENTS

JP       08-129576 A       5/1996

* cited by examiner

*Primary Examiner*—Jeffrey S Zweizig
(74) *Attorney, Agent, or Firm*—Buchanan Ingersoll & Rooney PC

(57) ABSTRACT

Regions G1 to G8 each including a predetermined number of flip-flops (FF) are divided into two groups. This dividing is performed so that the number of data connection channels intersected by a boundary is minimized. In the case of intersection of two data connection channels (A1, A2), the number of data connection channels intersected by the boundary is two, the minimum number. After grouping of all the regions (G1 to G4, G5 to G8), clock tree synthesis (CTS) is performed. If clock forming is performed in this way, the increase in clock skew on an actual device can be limited and on-chip variation resistance can be increased.

5 Claims, 5 Drawing Sheets

PRIOR ART

CLOCK FORMING METHOD FOR SEMICONDUCTOR INTEGRATED CIRCUIT AND PROGRAM PRODUCT FOR THE METHOD

BACKGROUND OF THE INVENTION

1. Field of the Invention

The present invention relates to a clock forming method for a semiconductor integrated circuit and a program product for the method, and more particularly, to the method and the program product for the improved on-chip-variation resistance.

2. Background Art

It is difficult to supply a clock accurately and correctly to all sequential elements of a large scale semiconductor integrated circuit (LSI). In ordinary cases, a clock is supplied to different portions at different times. The difference between times at which a clock is supplied is called a clock skew. With the increase in packaging density and the increase in degree of integration of LSIs, a need has arisen to reduce clock skews of a clock applied to different portions. Clock skews are produced mainly at the design stage. Therefore, clock skew control with high accuracy is required when a clock is formed.

In Japanese Unexamined Patent Publication No. 8-129576, a layout method described below. First, the size, shape and other properties of blocks and inter-block wiring channels are accurately estimated and a block arrangement is determined. Arrangement and wiring in each block are thereafter performed to reduce the clock skew from an external clock terminal to a clock terminal in the block. Further, wiring layout is performed so that the clock skew from a clock generation source to the external clock terminal is within a predetermined range.

FIG. 5 is a diagram showing an example of synthesis of a clock tree by a conventional clock forming method. Four flip-flops (FF) are placed in each of regions G1 to G8 in a circuit region 1. The regions G1 to G4 and the regions G5 to G8 are separated from each other by a boundary 2. Further, the regions G1 and G2 and the regions G3 and G4 are separated by a boundary 3a and the regions G5 and G6 and the regions G7 and G8 are separated by a boundary 3b.

A clock driver 4 is provided in each of the regions G1 to G8 and is connected to the FFs in the area. An upper-order clock driver 5 is provided between each of the adjacent pairs of the regions G1 and G2, G3 and G4, G5 and G6, and G7 and G8 to connect the clock drivers 4 in the adjacent pair of the regions. At each of the boundaries 3a and 3b, a further upper-order clock driver 6 is provided to connect the clock drivers 5. There are also provided data connection channels A1 to A4, B1 to B3, and C1 to C3 for data transfer between the regions.

Clock buffers (not shown) are connected to the clock drivers. Delay adjustment is performed so that the values of delays of clock signals to clock terminals of the FFs seen from the clock buffers are equal to each other. More specifically, arrangement and adjustment of clock buffers and insertion of a delay element to a faster path are performed. If a tool for performing such operates in an ideal manner, the delays of clock signals from a clock start point to all the FFs at terminal ends can be made equal to each other to reduce the clock skew to zero.

The above-described method is a clock forming method of reducing the clock skew to zero without considering on-chip variation. In actuality, however, on-chip variation exists. Therefore, if the data connection channels are not uniform, a difference occurs between an assumed delay value and the delay value on an actual device, so that the actual clock skew is not reduced to zero.

FIG. 6 shows the structure of a clock tree when data transfer is performed between the regions G2 and G5 (via the data connection channel A1) shown in FIG. 5. In this case, the clock signal passes through the clock drivers 4, 5, and 6. It is assumed here that the delay value with respect to one clock driver stage in a situation without consideration of on-chip variation is 1 ns, and that delay variation of ±10% due to on-chip variation occurs randomly. The delay value when on-chip variation is not considered is 3 ns. If on-chip variation of ±10% is considered, the delay value with respect to the data connection channel A1 is in the range from 2.7 to 3.3 ns and a skew of 600 ps (0.6 ns) at the maximum occurs.

FIG. 7 shows the structure of a clock tree when data transfer is performed between the regions G1 and G3 (via the data connection channel B1) shown in FIG. 5. In this case, the clock signal passes through the clock drivers 4 and 5. If the same assumption as that in the above is made, the delay value when on-chip variation is not considered is 2 ns. If on-chip variation of ±10% is considered, the delay value with respect to the data connection channel B1 is in the range from 1.8 to 2.2 ns and a skew of 400 ps (0.4 ns) at the maximum occurs. Similarly, when data transfer is performed via one of the data connection channels C1 to C3 shown in FIG. 5, the clock signal passes through the clock in one stage. Accordingly, the delay value of these data connection channels is in the range from 0.9 to 1.1 ns and a skew of 200 ps (0.2 ns) at the maximum occurs.

Any division of the regions G1 to G8 shown in FIG. 5 is not effective in preventing the occurrence of the above-described skew. Even in a situation where a large skew occurs when on-chip variation is considered, there is no problem in practice if data transfer is not performed between the corresponding regions. Conversely, if data transfer is performed between the regions between which a large skew can occur due to on-chip variation, there is a need to take measures to prevent the occurrence of a hold error and a setup error by considering on-chip variation.

In the above-described conventional clock forming method, a clock is formed without consideration of on-chip variation so that the clock skew is zero. There is, therefore, a problem that even if the clock skew reduced to zero, the clock skew increases on an actual device when on-chip variation is considered.

SUMMARY OF THE INVENTION

The present invention has been developed to solve the above-described problems, and therefore it is an object of the present invention to provide a provide a clock forming method which limits the increase in clock skew on an actual device and which ensures improved on-chip-variation resistance, and a program product for the method.

The above object is achieved by a clock forming method for a semiconductor integrated circuit that includes a first step of dividing a predetermined number of times a circuit region including a plurality of regions each having a predetermined number of elements and connection channels for transferring data between the plurality of regions, and a second step of synthesizing a clock tree by inserting clock drivers so that the elements in the regions divided in the first step are connected in tree form, wherein the number of the connection channels intersected by a boundary is minimized when the circuit region is divided.

The above object is achieved by a program product for causing a computer to execute a first step of dividing a predetermined number of times a circuit region including a plurality of regions each having a predetermined number of elements and connection channels for transferring data between the plurality of regions, a second step of synthesizing a clock tree by inserting clock drivers so that the elements in the regions divided in the first step are connected in tree form, wherein the number of the connection channels intersected by a boundary is minimized when the circuit region is divided.

According to the present invention, a clock forming method which limits the increase in clock skew on an actual device and which ensures improved on-chip-variation resistance and a program product for the method can be obtained.

Other features and advantages of the invention will be apparent from the following description taken in connection with the accompanying drawings.

DETAILED DESCRIPTION OF THE PREFERRED EMBODIMENTS

Figure 1:
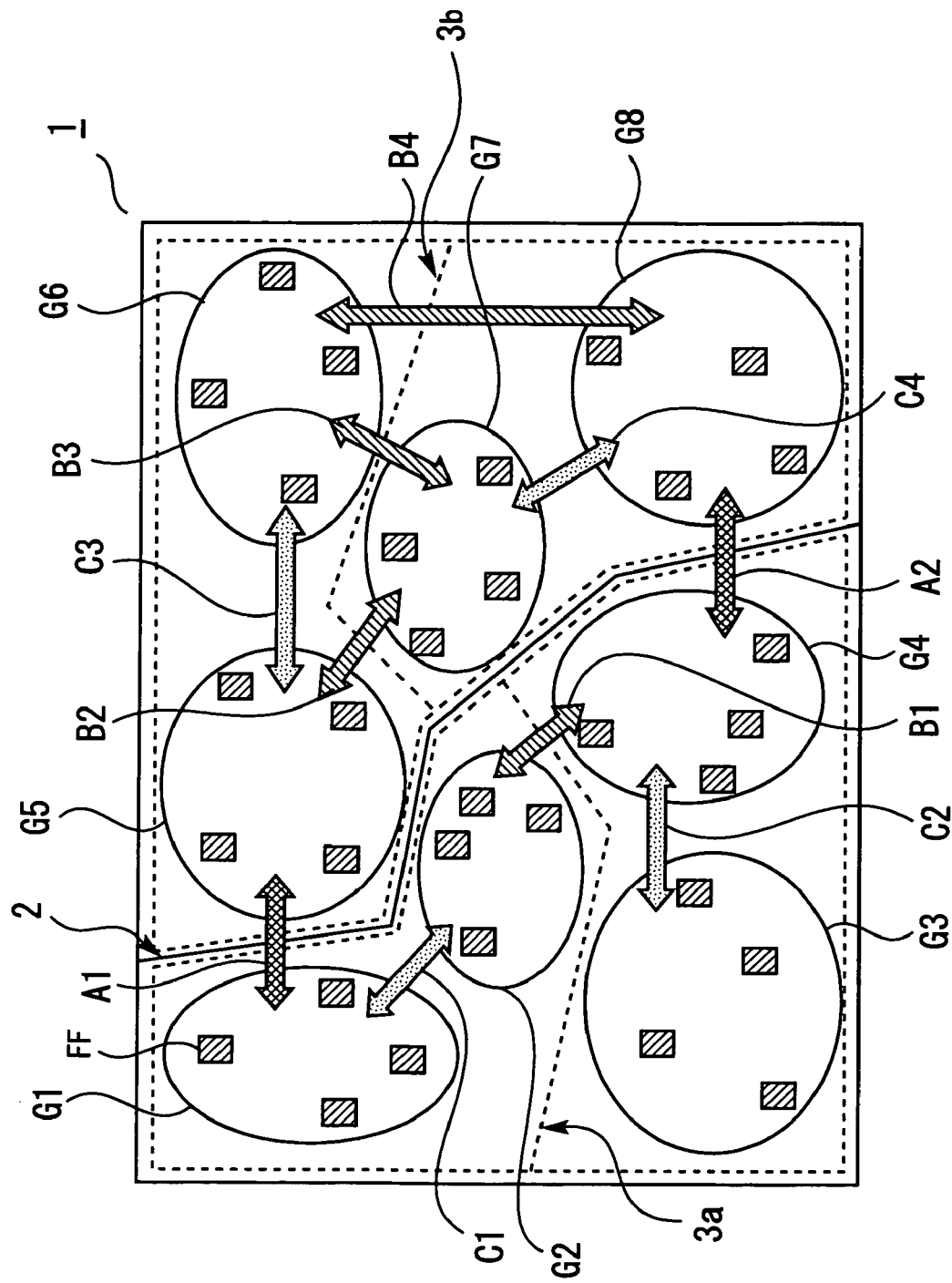
FIG. 1 shows a clock forming method of the first embodiment.

Embodiments of the present invention will be described below referring to the drawings. In the drawings, the same or equivalent parts will be denoted by the same reference numerals, and the description thereof will be simplified or omitted.

First Embodiment

A clock forming method for a semiconductor integrated circuit according to the first embodiment of the present invention will be described. The clock forming method described below is a method of performing clock tree synthesis (hereinafter referred to as "CTS") after dividing a circuit region (grouping).

A method of dividing a circuit region into groups of regions will first be described. As shown in FIG. 1, a multiplicity of flip-flops (hereinafter referred to "FF") exit in a circuit region 1. As a standard method of dividing into groups regions, a method of grouping FFs into groups of equal numbers of FFs or a method of dividing an area into equal parts may be used. An example of grouping by dividing a region into equal parts for equal number of FFs will be described below.

As shown in FIG. 1, each of regions G1 to G8 contains four FFs. Connection channels for data transfer between certain regions (hereinafter referred to as "data connection channel") exist between the regions G1 to G8. Data connection channels A1 and A2 exist between the regions G1 and G5 and between the regions G4 and G8, respectively. Data connection channels B1, B2, B3, and B4 exist between the regions G2 and G4, between the regions G5 and G7, between the regions G6 and G7 and between the regions G6 and G8, respectively. Further, data connection channels C1, C2, C3, and C4 exist between the regions G1 and G2, between the regions G3 and G4, between the regions G5 and G6 and between the regions G7 and G8, respectively.

Grouping is performed to divide the regions G1 to G8 into a group of regions G1 to G4 and a group of regions G5 to G8 by a boundary 2. Grouping is further performed to divide the regions G1 to G4 into a group of regions G1 and G2 and a group of regions G3 and G4 by a boundary 3a. Also, grouping is performed to divide the regions G5 to G8 into a group of regions G5 and G6 and a group of regions G7 and G8 by a boundary 3b. (These boundaries are not lines actually existing on the circuit region 1 but virtual lines.)

When the above-described grouping is performed, a graph theory is used to perform grouping so that the number of data connection channels intersected by each boundary is minimized. If the regions G1 to G8 are divided into two groups so that the boundary by which the regions are divided intersects the data connection channels A1 and A2, the number of data connection channels intersected by the boundary is two, the minimum number. Thus, the regions G1 to G4 and the regions G5 to G8 are divided into two groups by the boundary 2. The above-described graph theory is well-known and no further description will be made of it.

If the regions G1 to G4 are divided into two groups so that the boundary by which the regions are divided intersects the data connection channel B1, the number of data connection channels intersected by the boundary is one, the minimum number. Thus, the regions G1 and G2 and the regions G3 and G4 are divided into two groups by the boundary 3a. When the regions G5 to G8 are divided into two groups, the number of data connection channels intersected by the boundary is three irrespective of in which way the regions are divided. In such a case, the regions are divided so that the boundary 3b intersects a data connection channel of a longer channel length with priority. That is, the regions are divided so that the boundary intersects a larger number of data connection channels having longer interconnection distances. In this example of dividing, the interconnection distance between the regions G6 and G8 is the largest among the data connection channels between the regions G5 to G8. Accordingly, intergroup wiring is provided between the regions G6 and G8 such that the data connection channel B4 is intersected. Thus, the regions G5 and G6 and the regions G7 and G8 are divided into two groups by the boundary 3b.

In the above-described grouping of the regions G5 to G8 into two groups, a determination measure "to make the boundary intersect a larger number of data connection channels having longer interconnection distances" is used. In place of such a determination measure, "to maximize the sum of interconnection distances intersected by a boundary", "to minimize the number of wiring lines having interconnection distances equal to or smaller than a predetermined value intersected by a boundary", or "to maximize the sum of the number of wiring lines having interconnection distances equal to or smaller than a predetermined value intersected by a boundary" may be adopted. Also, "having longer connection distances" in the above-described measure may be replaced with "having a larger number of on-data-line logic stages (cells).

CTS is executed on the circuit region 1 divided into groups of regions. That is, clock drivers are inserted so as to connect the FFs in the circuit region 1 in tree form, thereby synthesizing a clock tree. Each FF in each of the regions G1 to G8 is thereby connected to one clock driver (which is not illustrated). For example, the four FFs existing in the region G1 are connected to one clock driver. An upper-order clock driver is inserted between the regions G1 and G2 to connect with the clock drivers in the two regions. Similarly, clock drivers are inserted between the regions G3 and G4, between the regions G5 and G6 and between the regions G7 and G8 to connect with the clock drivers in the regions. Further, a clock driver is inserted on the boundary 3a to connect with the clock driver between the regions G1 and G2 and with the clock driver between the regions G3 and G4. Similarly, a clock driver is inserted on the boundary 3b to connect with the clock driver between the regions G5 and G6 and with the clock driver between the regions G7 and G8. A clock tree is formed in this way.

Figure 2:
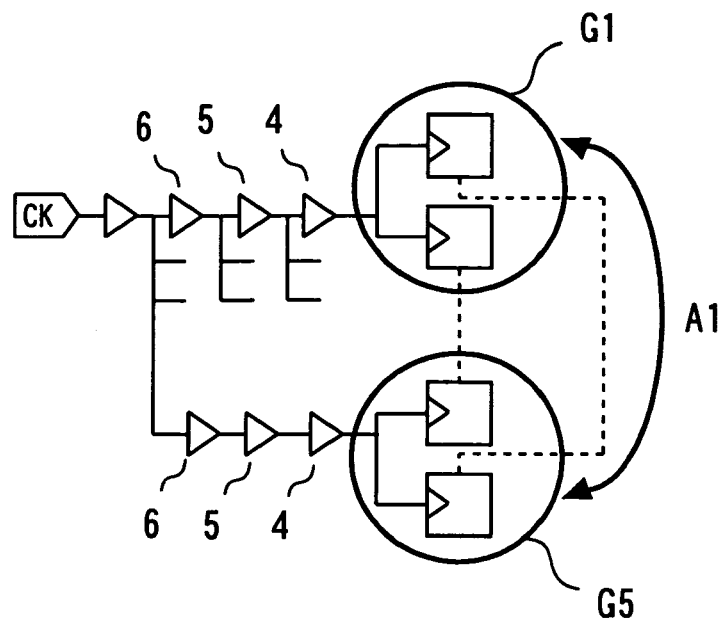
FIGS. 2 and 3 show a clock tree synthesized by the method of the first embodiment.

FIG. 2 shows the structure of the clock tree synthesized between the regions G1 and G5 (through the data connection channel A1) shown in FIG. 1 by the above-described clock tree synthesis. When data transfer is performed via the data connection channel A1, a clock signal passes through clock drivers 4, 5 and 6 in three stages. If on-chip variation of 200 ps exists with respect to the clock driver in each stage, a clock skew of 600 ps at the maximum occurs in the data connection channel A1. A clock skew of 600 ps at the maximum also occurs between the regions G4 and G8 (in the data connection channel A2) shown in FIG. 1.

Figure 3:
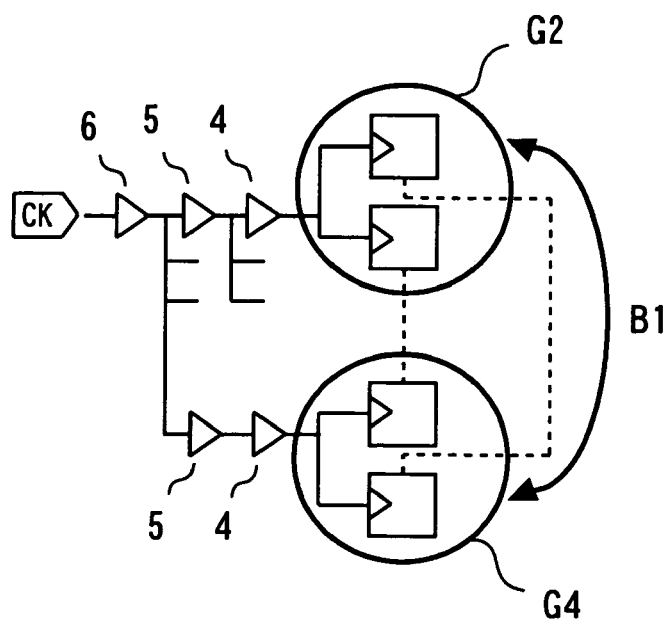

FIG. 3 shows the structure of the clock tree synthesized between the regions G2 and G4 (through the data connection channel B1) shown in FIG. 1. When data transfer is performed via the data connection channel B1, the clock signal passes through the clock drivers 4 and 5 in two stages. If the same assumption as that in the above is made, a clock skew of 400 ps at the maximum occurs in the data connection channel B1. A clock skew of 400 ps at the maximum also occurs between the regions G5 and G7 (in the data connection channel B2), between the regions G6 and G7 (in the data connection channel B3) and between the regions G6 and G8 (in the data connection channel B4).

When data transfer (not shown) is performed between the regions G1 and G2 (via the data connection channel C1), between the regions G3 and G4 (via the data connection channel C2), between the regions G5 and G6 (via the data connection channel C3) and between the regions G7 and G8 (via the data connection channel C4), the clock signal passes through the clock driver in one stage. If the same assumption as that in the above is made, a clock skew of 200 ps at the maximum occurs in the data connection channels.

Figure 5:
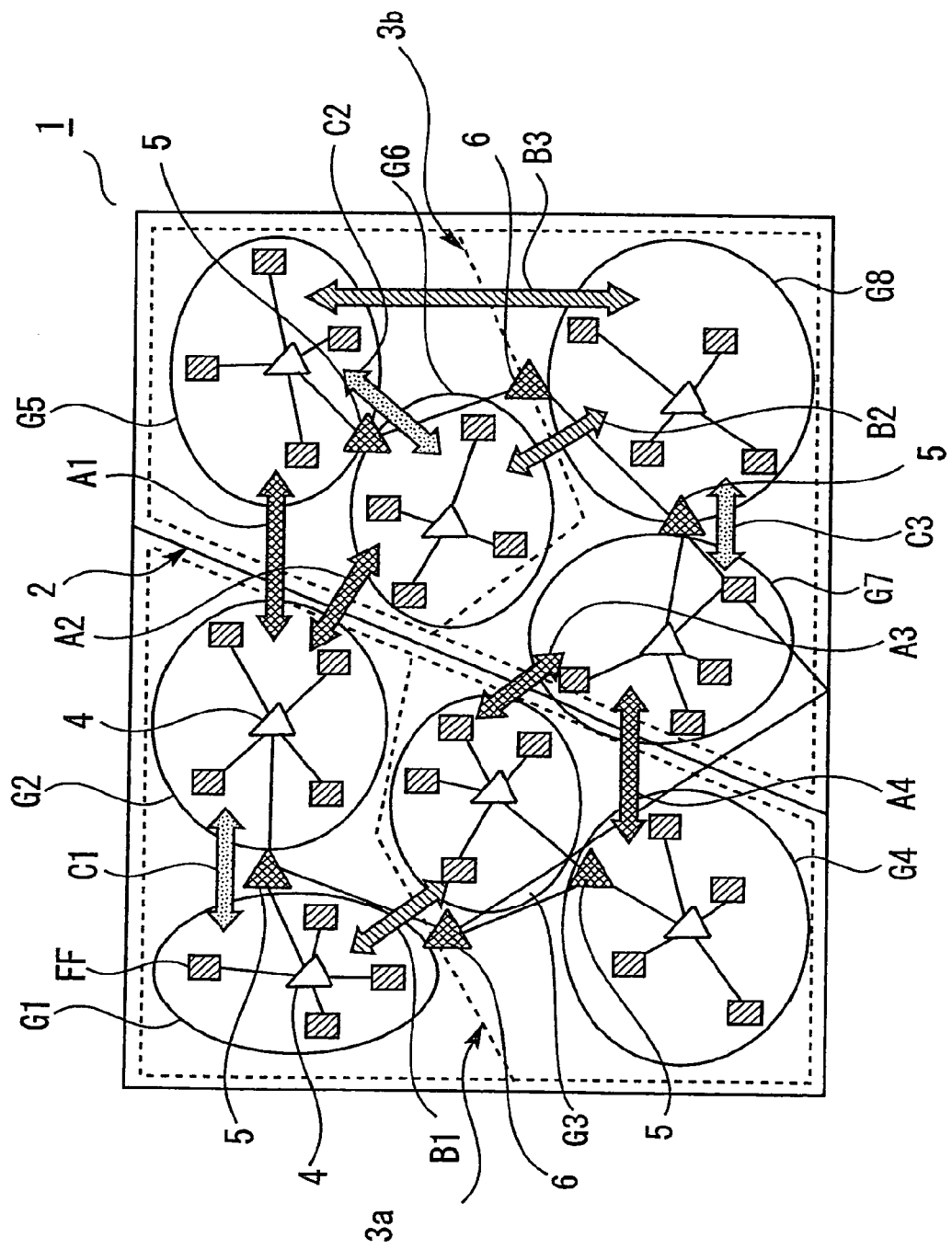
FIG. 5 shows a conventional clock forming method.
Figure 6:
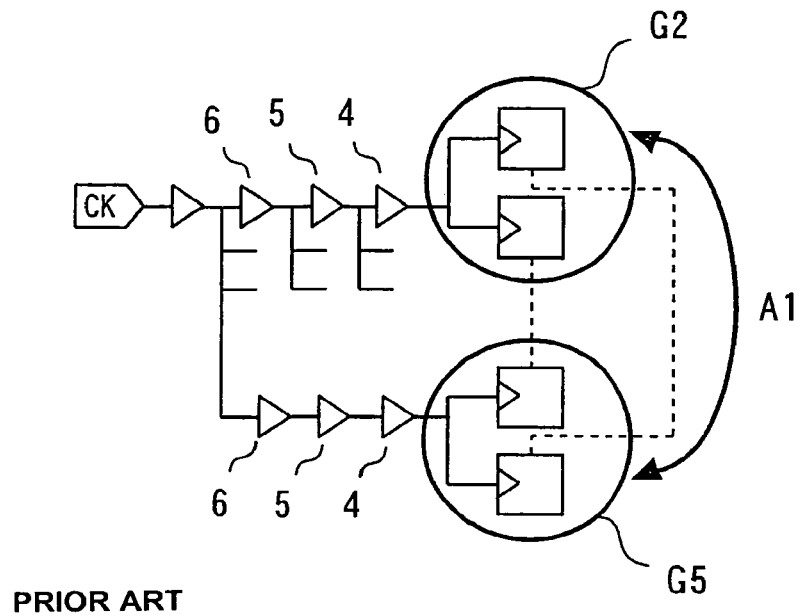
FIGS. 6 and 7 show a clock tree synthesized by a conventional clock forming method.
Figure 7:
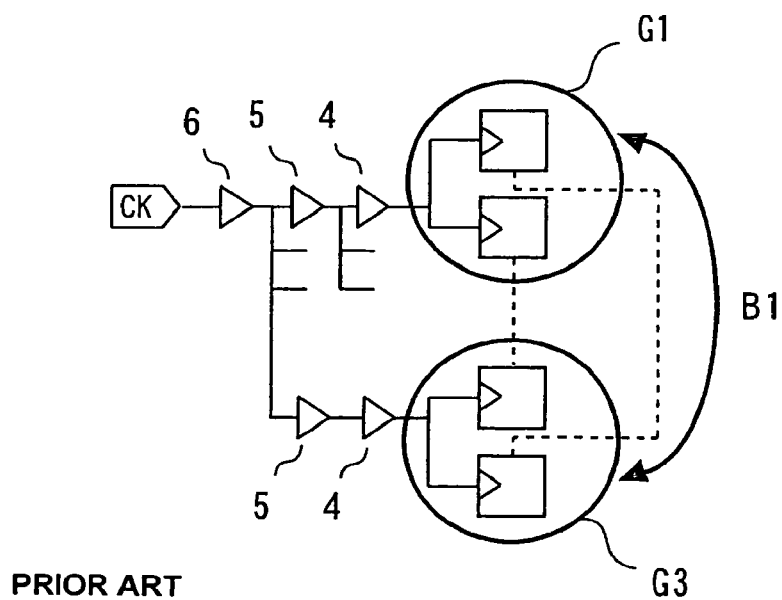

That is, the data connection channels A1 and A2 are lower in on-chip-variation resistance than the other channels in the circuit region 1. In this embodiment, the circuit region 1 is divided into groups of regions so that the number of data connection channels intersected by a boundary is minimized. In this way, data connection channels having lower on-chip-variation resistance can be reduced in comparison with the conventional art (see FIG. 5). More specifically, while the number of data connection channels in which a clock skew of 600 ps at the maximum can occur is four, the number of corresponding data connection channels can be reduced to two in this embodiment (see FIG. 1). Thus, the increase in clock skew on an actual device can be limited and the on-chip-variation resistance can be increased.

Grouping of the regions G5 and G6 and the regions G7 and G8 is performed so that the boundary 3b intersects the data connection channel B4. In this case, the data transfer delay through the data connection channel B4 is increased since the interconnection distance of the data connection channel B4 is larger than those of the data connection channels B2 and B3. Therefore, no hold error occurs even if a certain amount of clock skew is caused. As a result, measures against on-chip variation can be minimized.

Second Embodiment

Figure 4:
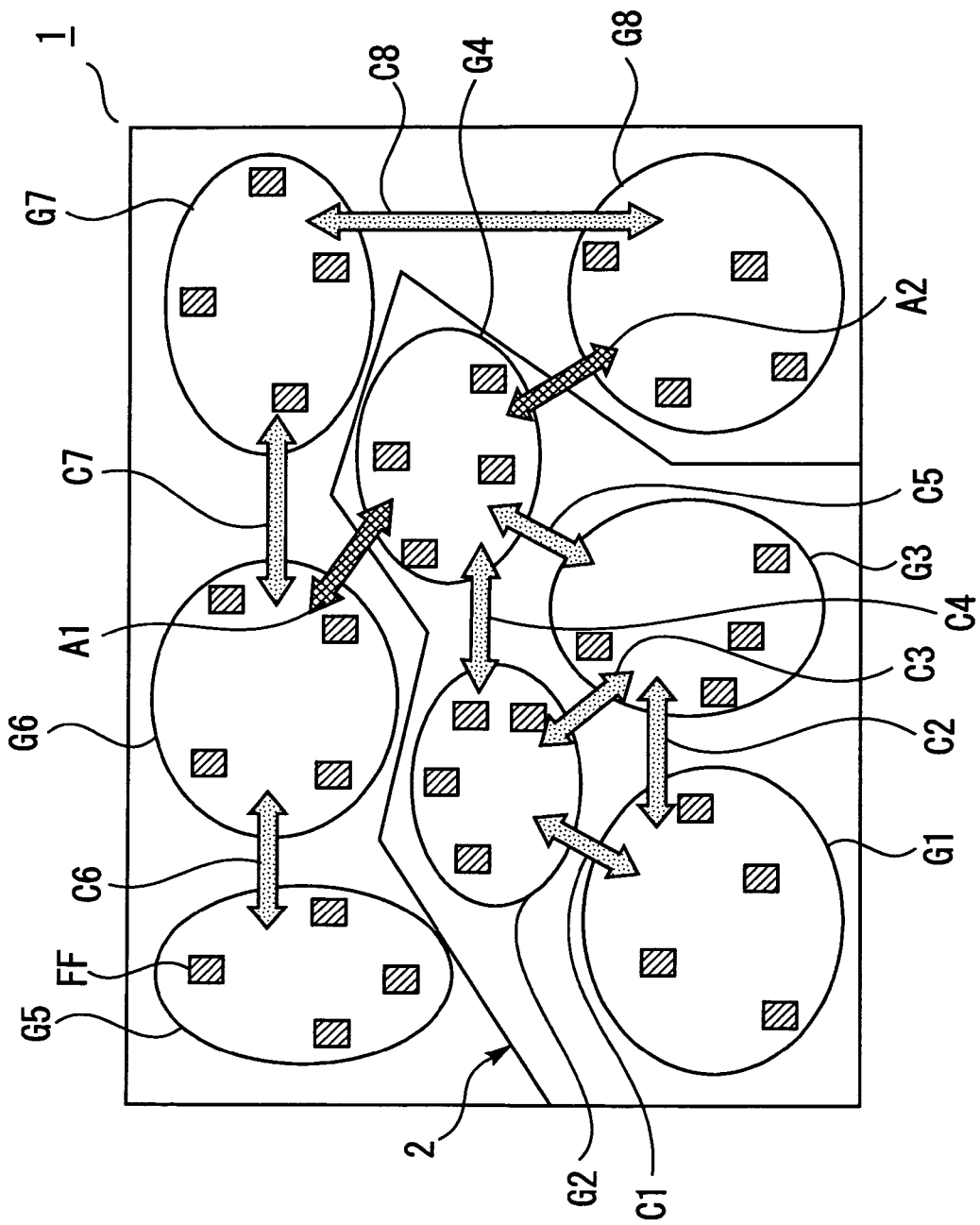
FIG. 4 shows a clock forming method of the second embodiment.

A clock forming method for a semiconductor integrated circuit according to the second embodiment of the present invention will be described. The second embodiment will be described with respect to points of difference from the first embodiment. In the above-described grouping method in the first embodiment, grouping is performed so that the number of data connection channels intersected by a boundary is minimized. With respect to grouping by this method, dividing into a group of regions G1 to G4 and a group of regions G5 to G8 as shown in FIG. 4 is conceivable.

In this case, the number of data connection channels intersected by the boundary 2 is two, the minimum number. However, the regions G5 to G8 extend largely along the periphery of the circuit region 1. Therefore, if CTS is executed in the state shown in FIG. 4, the clock delay is increased. An increase in clock delay leads to a reduction in on-chip-variation resistance. For this reason, dividing such as described above is not preferable.

In this embodiment, therefore, a restriction is imposed on the above-described grouping in the first embodiment such that an FF located at a distance larger than a certain distance from the centroid of a region is not contained in the same region. That is, a restriction is given such that the positions of FFs contained in a region after dividing into groups of regions are within a predetermined distance from the centroid of the region. A different restriction may alternatively be given such that the distance between the remotest two FFs is equal to or smaller than a certain value. If such a restriction is provided, an increase in clock delay and, hence, a reduction in on-chip-variation resistance can be prevented.

The above-described grouping in the first embodiment is an example of an arrangement in which a boundary intersects a data connection channel having a larger interconnection distance (or a larger number of logic stages) with priority and an intergroup wiring line is thereby formed. However, if this data connection channel is a critical path without a sufficient setup timing margin, there is a possibility of this path becoming an error path due to the influence of on-chip variation when used as an intergroup wiring line. Therefore, a restriction may be imposed such that a path determined in advance as not having a sufficient setup timing margin is not assigned as an intergroup wiring line. That is, a restriction is given such that a boundary for the above-described grouping in the first embodiment does not intersect a data connection channel with a setup margin equal to or smaller than a predetermined value, thus effectively preventing the occurrence of an error path due to on-chip variation.

In the first and second embodiments, a technique of taking a solution to minimize the number of intergroup connection wiring lines with the highest priority at the time of grouping and determining the priority according to a different factor if a plurality of the same solutions exist has been described. However, even in a case where the priority is determined in a different way, a similar effect can also be obtained. A method of treating all factors as function values and determining them at a time by a weighting evaluation function is generally known well. Such a method can also be applied to the present invention.

In the first and second embodiments, clock forming methods have been described in which CTS is performed after dividing a circuit region (grouping circuit regions). The same effects as the above-described clock forming methods can also be obtained by preparing each method as a program product for executing the method by means of a piece of program-controllable hardware (computer or the like) and by executing the program.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-309861, filed on Oct. 25, 2005 including specification, claims, drawings and summary, on which the Convention priority of the present application is based, are incorporated herein by reference in its entirety.

The invention claimed is:

1. A clock forming method for a semiconductor integrated circuit comprising the steps of:
   a first step of dividing a circuit region into plural regions, each region having plural elements and connection channels for transferring data between the plurality of regions; and
   a second step of synthesizing a clock tree by inserting clock drivers so that the elements in each region are connected in tree form,
   wherein the number of connection channels intersected by a boundary is minimized when the circuit region is divided, and
   wherein when the circuit region is divided, the positions of the elements contained in each region after dividing are within a predetermined distance from a centroid of the region.

2. The method according to claim 1, wherein when the circuit region is divided, the boundary intersects the connection channels having a longer channel length or the connection channels having a larger number of logic stages with priority.

3. A clock forming method for a semiconductor integrated circuit, the method comprising:
   a first step of dividing a circuit region into plural regions, each region having plural elements and connection channels for transferring data between the plurality of regions;
   a second step of synthesizing a clock tree by inserting clock drivers so that the elements in each region are connected in tree form;
   wherein the number of connection channels intersected by a boundary is minimized when the circuit region is divided, and
   wherein when the circuit region is divided, the boundary does not intersect the connection channels having a setup margin equal to or smaller than a predetermined value.

4. A program product for causing a computer to execute a clock forming for a semiconductor integrated circuit:
   a first step of dividing a circuit region into plural regions each region having plural elements and connection channels for transferring data between the regions; and
   a second step of synthesizing a clock tree by inserting clock drivers so that the elements in each region are connected in tree form,
   wherein the number of the connection channels intersected by a boundary is minimized when the circuit region is divided, and
   wherein when the current region is divided, the positions of the elements contained in each region after dividing are within a predetermined distance from the centroid of the region or the boundary does not intersect the connection channels having a setup margin equal to or smaller than a predetermined value.

5. The program product according to claim 4, wherein when the circuit region is divided, the boundary intersects the connection channels having a longer channel length or the connection channels having a larger number of logic stages with priority.

* * * * *